United States Patent
Hush et al.

(10) Patent No.: US 7,251,177 B2
(45) Date of Patent: *Jul. 31, 2007

(54) SKEWED SENSE AMP FOR VARIABLE RESISTANCE MEMORY SENSING

(75) Inventors: Glen Hush, Boise, ID (US); R. Jacob Baker, Meridian, ID (US); John Moore, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/089,132

(22) Filed: Mar. 24, 2005

(65) Prior Publication Data

US 2005/0180208 A1 Aug. 18, 2005

Related U.S. Application Data

(63) Continuation of application No. 10/434,087, filed on May 9, 2003, now Pat. No. 6,888,771.

(51) Int. Cl.
*G11C 7/02* (2006.01)

(52) U.S. Cl. ................. 365/208; 365/185.08; 365/203; 365/207

(58) Field of Classification Search ................. 365/208, 365/185.08, 203, 207
See application file for complete search history.

(56) References Cited

U.S. PATENT DOCUMENTS

| 6,191,989 | B1 | 2/2001 | Luk et al. |
| 6,504,750 | B1 | 1/2003 | Baker |
| 6,567,297 | B2 | 5/2003 | Baker |
| 6,741,495 | B2 | 5/2004 | Kunikiyo et al. |
| 6,873,538 | B2 * | 3/2005 | Hush ........................... 365/148 |
| 6,888,771 | B2 * | 5/2005 | Hush et al. .................. 365/208 |
| 2002/0006058 | A1 | 1/2002 | Nakajlma et al. |
| 2002/0008987 | A1 | 1/2002 | Numata et al. |
| 2002/0054500 | A1 | 5/2002 | Yamada |
| 2004/0012995 | A1 | 1/2004 | Ishikawa |

FOREIGN PATENT DOCUMENTS

EP 0700049 A1 3/1996

* cited by examiner

*Primary Examiner*—Anh Phung
*Assistant Examiner*—Pho M. Luu
(74) *Attorney, Agent, or Firm*—Dickstein Shapiro LLP

(57) ABSTRACT

A variable resistance memory sense amplifier has a built-in offset to assist in switching the sense amplifier when a resistive memory cell is in a low resistance state. The built-in offset can be achieved by varying size, threshold voltage, associated capacity or associated resistance of the transistors within the sense amplifier.

39 Claims, 6 Drawing Sheets

SKEWED SENSE AMP FOR VARIABLE RESISTANCE MEMORY SENSING

This application is a continuation of application Ser. No. 10/434,087, filed May 9, 2003 now U.S. Pat. No. 6,888,771 which is hereby incorporated by reference.

FIELD OF THE INVENTION

The invention relates to a method and apparatus for sensing the resistance of a variable resistance memory element.

BACKGROUND OF THE INVENTION

Variable resistance memory devices store binary data as two different resistance values, one higher than the other. Variable resistance memories differ from DRAMs in that they represent a binary value as a resistance of a resistive memory element rather than as a charge on a capacitor. The resistance value represents a particular binary value of logic "0" or logic "1". Variable resistance memories are non-volatile, where the capacitor structures employed in DRAMs are volatile. When sensing the resistance value of a variable resistance memory device, it is possible to compare the resistance of a memory cell undergoing a read operation with resistance of a reference cell to determine the resistance value of the cell being read and thus its logic state. However, if the reference cell is defective and a column of memory cells within an array uses the same defective reference cell, the entire column of memory cells will have erroneous resistance readings. In addition, specialized circuitry is required to set the resistance value of a reference cell, and a sense amplifier circuit for such an arrangement tends to be complex and large.

Also, sensing schemes for variable resistance memory devices typically have a unique architecture which is different from that employed in typical DRAM circuits. Large volumes of DRAMs are produced and DRAM sensing technology is well developed. Devices employing DRAM sensing technology, thus benefits from technological maturity and efficiencies of manufacturing scales. Therefore, it is desirable for the read and write circuit of resistance memory devices to be as similar as possible to those of existing DRAM memory devices.

BRIEF SUMMARY OF THE INVENTION

The present invention provides a sense amplifier for sensing the resistance state of a variable resistance memory cell. The sense amplifier is joined to the memory cell via first and second column lines. The column lines are first precharged to have an electrical potential therebetween. Thereafter, the electric potential between the column lines is discharged by allowing electric current to flow through the variable resistance memory cell. The time required for the electrical potential between column lines to fully discharge is determined, in part, by the resistance of the variable resistance memory cell. Column lines discharged through a memory cell in a low-resistance state will discharge more quickly than column lines discharged through a memory cell in a high-resistance state. Therefore, the discharge state of the column lines at a particular sensing time may be sensed to discover whether a memory cell connecting the column lines is in a high-resistance or low-resistance state. The discharge state of the column lines is sensed after a time interval sufficient to fully discharge the electrical potential between column lines through a low-resistance memory cell but insufficient to fully discharge the electrical potential between column lines through a high-resistance memory cell. If, at the sensing time, the column lines are at equal electrical potential, then the resistance memory cell connecting the column lines is known to be in a low-resistance state. If, at the sensing time, the column lines are not at equal electrical potential, then the resistance memory cell connecting the column lines is known to be in a high-resistance state.

In one embodiment, the sense amplifier comprises a pair of cross-coupled transistors of a first conductivity, a pair of cross-coupled transistors of a second conductivity, a transistor of the first conductivity coupled to a first sense line, and a transistor of the second conductivity coupled to a second sense line. The pair of cross-coupled transistors of the first conductivity are fabricated to differ from each other so that an offset voltage exists between them. In operation, column lines are precharged to produce a predetermined voltage differential between them, and then a selected memory cell is enabled to shunt the column lines with the resistance of the cell. The sense amplifier is operated at a predetermined period of time after the column lines are bridged and senses whether the lines have equilibrated or not, based on the resistance of the cell.

In another exemplary embodiment, the offset sense amplifier includes a pair of cross-coupled transistors of a first conductivity, and a transistor of the first conductivity coupled to a first sense line.

A method of operating the variable resistance memory array is also provided.

BRIEF DESCRIPTION OF THE DRAWINGS

These and other aspects of the invention will be more clearly understood from the following detailed description which is provided in conjunction with the accompanying drawings.

DETAILED DESCRIPTION OF THE INVENTION

Figure 1:
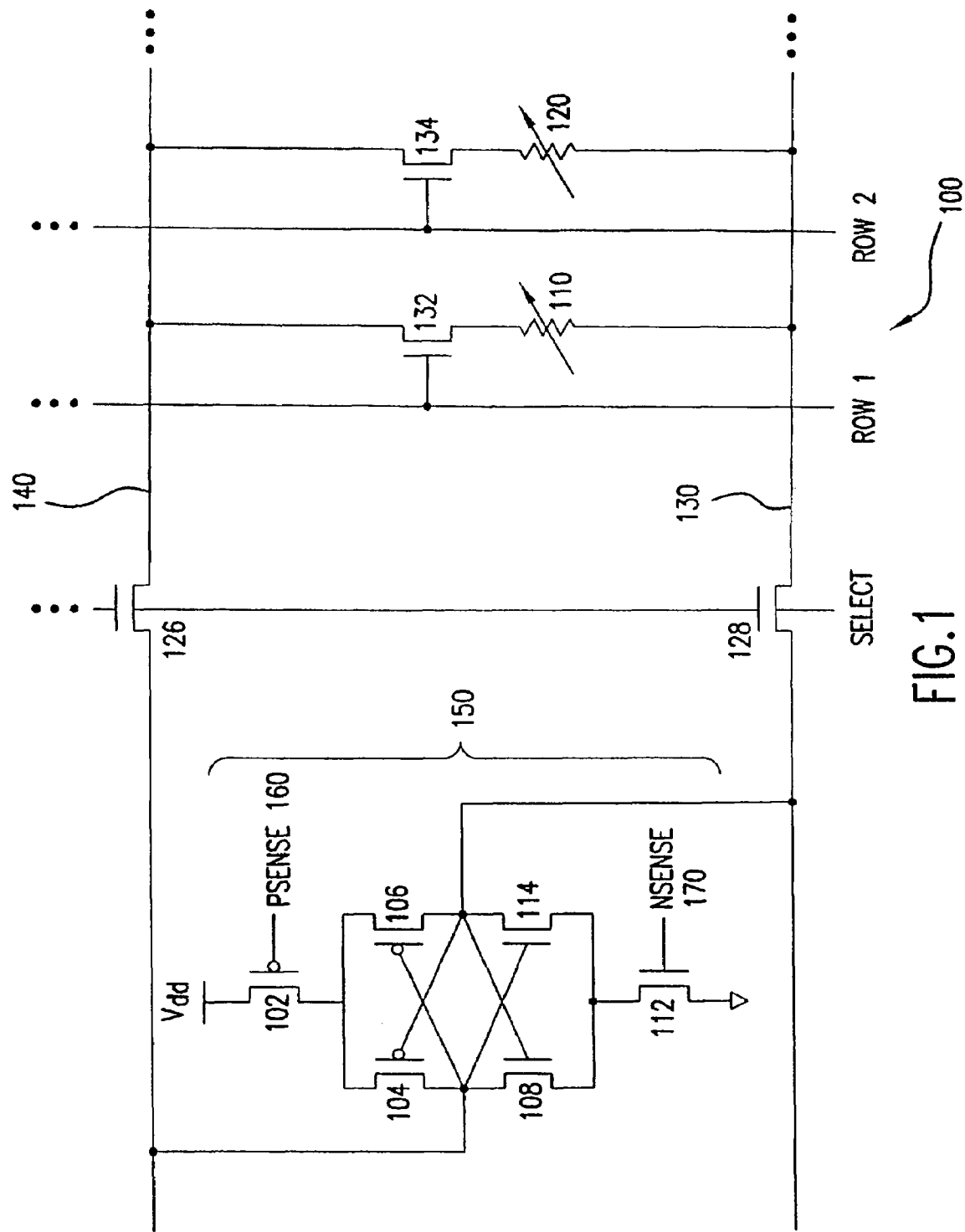
FIG. 1 shows an exemplary embodiment of the invention.

FIG. 1 shows a portion of a memory array 100 constructed in accordance with a first exemplary embodiment of the invention, wherein a pair of exemplary variable resistance memory cells 110 and 120 are connected between column lines 130, 140. An unbalanced sense amplifier 150 is also connected between column lines 130, 140. The sense amplifier 150 has both a P-channel and an N-channel portion. The P-channel portion has transistors 102, 104, and 106, and is connected to a P-sense line 160. The N-channel portion has transistors 108, 112, and 114, and is connected to an N-sense line 170. Select transistors 126 and 128 select the particular column to be sensed. Enabling transistors 132 or 134 select the particular memory cell 110, 120 to be sensed.

Prior to the sense operation, the column line 140 can be precharged to 820 mV for example, while the column line 130 can be pre-charged to 600 mV, for example. Accordingly, a differential voltage is established between column lines 140, 130. During a sense operation, the pre-charged column lines 130, 140 are shunted together by the resistance of a selected memory cell. During such an operation it is important to prevent an accidental write to selected memory cells. To prevent accidental writing, in most circumstances the differential voltage across selected memory cells 110, 120 is kept at less than 250 mV.

Figure 2:
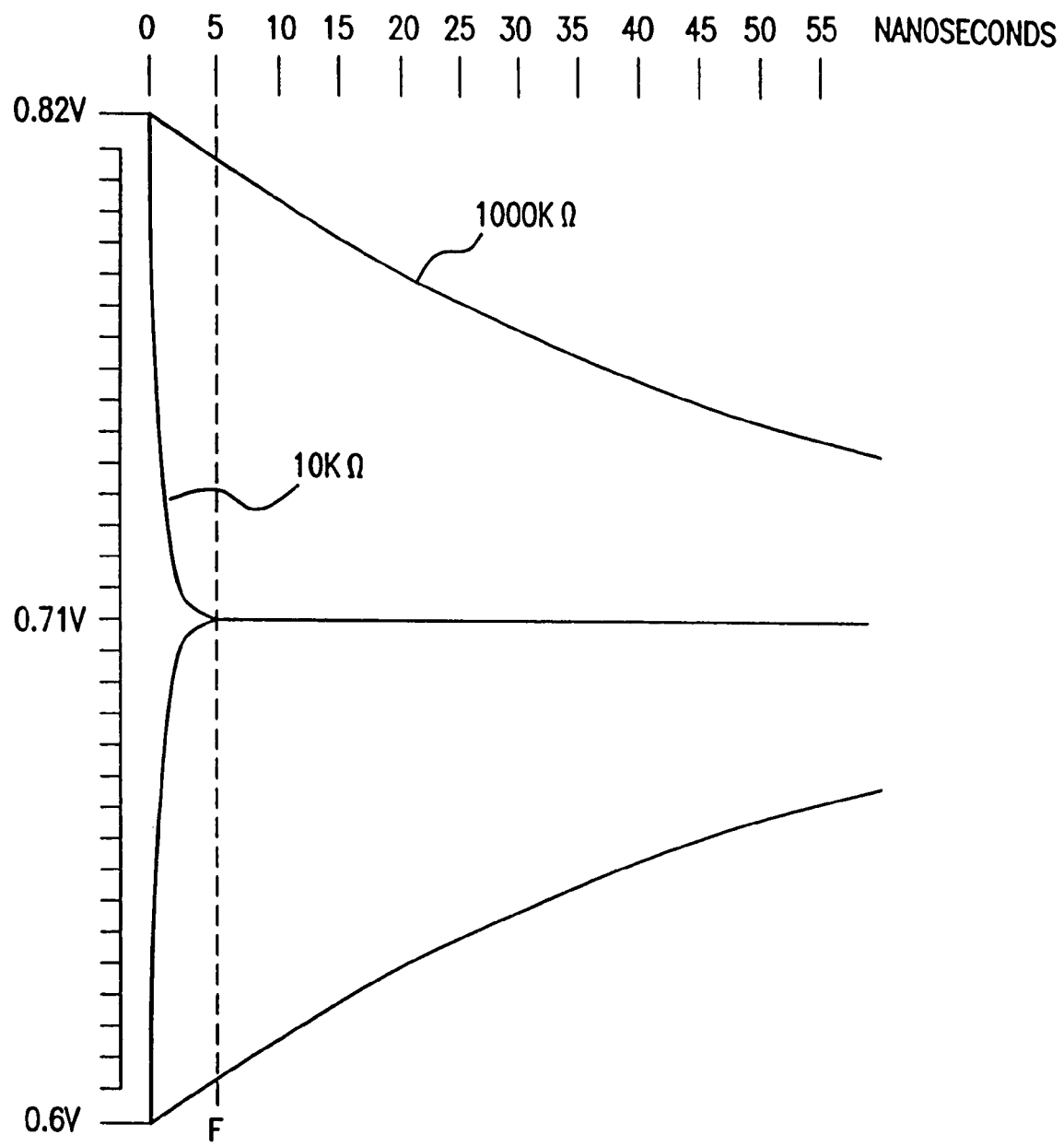
FIG. 2 shows the timing of the invention during a sensing operation.

As shown in FIG. 2, the two column lines adjoining the resistance 110 are initially precharged to a 220 mV difference (0.82 v–0.60 v). Using the memory cell 110 as an example, when access transistor 132 is turned on, the column lines 130, 140 will "equilibrate" or come together towards a common voltage (0.71 v). The value of the resistance contained in the memory cell 110 as well as the capacitance within the column lines 130, 140 will determine how quickly the equilibration process reaches completion. For example, if the memory cell 110 holds a low (e.g., 10 KΩ) resistance value, the equilibration process should reach completion in approximately 5 nanoseconds as shown in FIG. 2. Conversely, when the memory cell 110 holds a high (e.g., 1 MΩ) resistance value, the equilibration process will not reach completion until several hundred nanoseconds have elapsed.

The exemplary embodiment of the invention detects two voltage states. The first state is when, at a sensing time, column lines 130, 140 are at an approximately equal voltage (logic '0'), and the second is when they are approximately 200 mV apart (logic '1'). Using the unbalanced sense amplifier 150 of the present invention allows the detection of both states. When column lines 130, 140 are at approximately the same voltage a typical voltage sense amplifier would not operate. A minimum of 100 mV of difference between column lines 130, 140 is needed to determine that one column line has a greater voltage than the other. By intentionally skewing the sense amplifier 100 mV in one direction, the state when 130, 140 are at substantially equal voltage levels will always sense in the direction of the skew. To sense in the opposite direction, the voltage difference on 130, 140 must be enough to overcome the skew (100 mV) plus another 100 mV that a typical sense amplifier needs to determine which voltage is higher. In the FIG. 2 embodiment, for an exemplary 10 KΩ resistance, after 5 nanoseconds the two column lines 130, 140 are very close to equal voltage at approximately 710 mV. Conversely, for an exemplary 1 MΩ resistance, after 5 nanoseconds the two column lines 130, 140 are at approximately 200 mV apart. The present invention determines the difference between the high and low states—1 MΩ and 10 KΩ—by using a simple voltage sense amplifier similar to those used in DRAMs. One example is shown by the sense amplifier 150 in FIG. 1, although the invention is not exclusively limited to such a configuration.

When the memory cell 110 is in the high resistance state (e.g. 1 MΩ), the sense amplifier 150 has no difficulty determining that resistance because it is very easy for the sense amplifier 150 to detect the large voltage difference between the column lines 130, 140, as shown in FIG. 2. This is because, after 5 nanoseconds, the voltage on the two column lines 130, 140 is still very far apart. Without an offset, however, when the memory cell has a low (10 KΩ) resistance, the voltage across the column lines 130, 140 is not sufficient for the sense amplifier 150 to "flip" as the sense amplifier 150 cannot distinguish which line is higher or lower. This problem is solved by intentionally introducing a 100 mV offset for one input of the sense amplifier 150. The offset has the effect of flipping or forcing the sense amplifier 150 to transition when the column lines are substantially equal in voltage. Thus the 100 mV offset assures that the sense amplifier will reach a deterministic result when the sensed resistance is in a low (10 KΩ) state. Furthermore, adapting a traditional sense amplifier to have the features exemplified by the illustrated sense amplifier 150 requires only minor modifications to the fabrication process of a conventional DRAM sense amplifier.

The offset described above can be implemented in numerous ways. One way is to fabricate transistor 104 to be approximately 75% of the channel width of transistor 106. Another exemplary way is to fabricate the cross-coupled transistors 104 and 106 such that they have different threshold (Vt) voltages. The sense amplifier 150 can also be fabricated with an associated capacitive and/or resistive circuit to provide the offset.

Figure 3A:
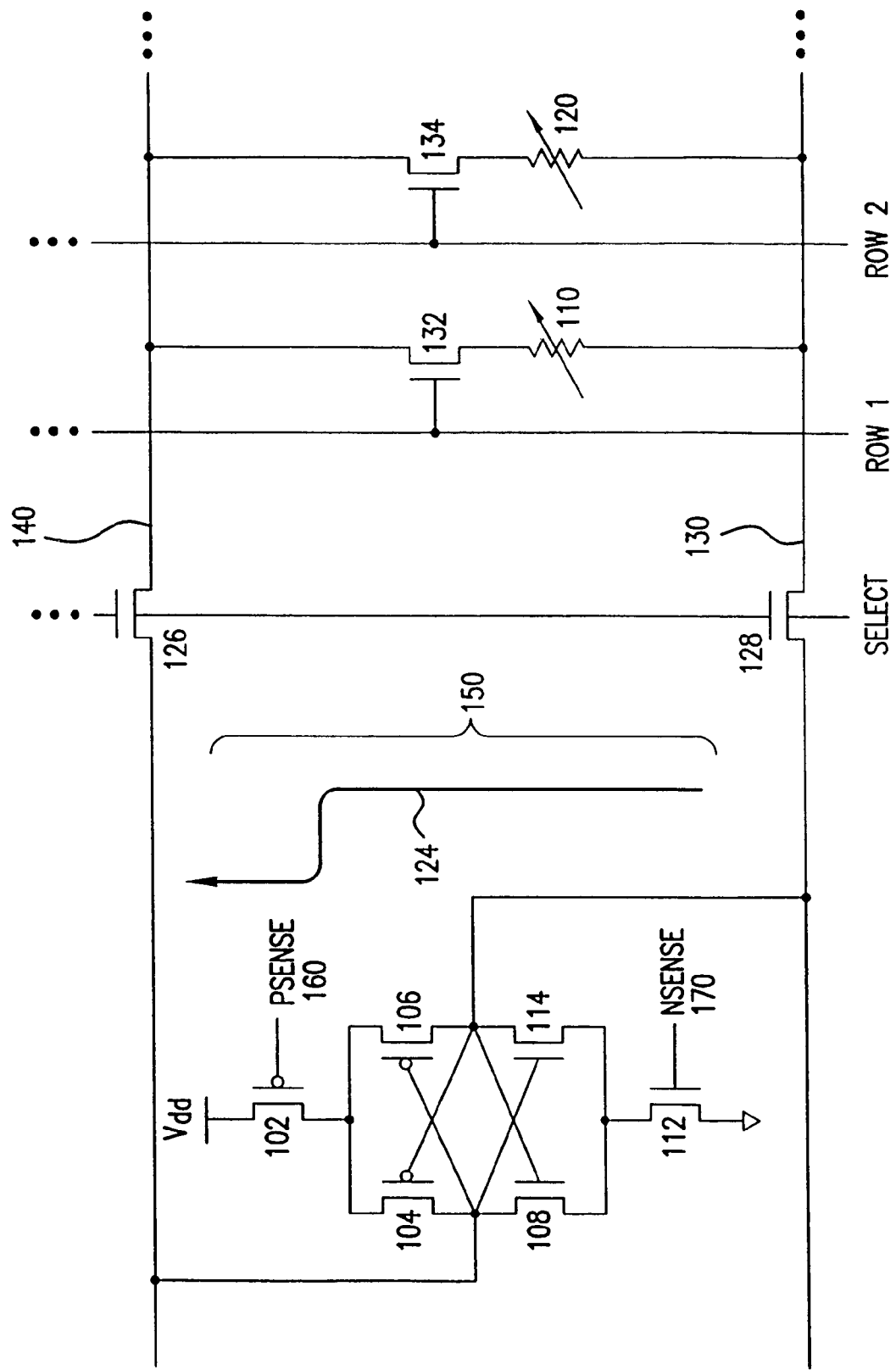
FIG. 3A shows an exemplary circuit according to the invention during sensing of a memory cell in a low-resistance state.

The process by which a low (10 KΩ) resistance memory cell is sensed by a sense amplifier according to the invention will now be described in further detail with reference to FIG. 3A. In FIG. 3A one sees a resistive memory cell 110 to be sensed. For this example, the resistive memory cell 110 is in a low resistance state, exhibiting a resistance of, for example, approximately 10 KΩ. The resistive memory cell 110 is coupled in series with a transistor 132 between first 130 and second 140 column lines. The transistor 132 includes a gate coupled to a row line designated row 1.

During a preliminary time interval transistor 132 is in a non-conductive state and a differential electrical potential is established between the column lines 130, 140. Thereafter, at an initial time, a first enabling signal is applied to row 1. Responsively, transistor 132 conducts electrical current, indicated by arrow 119, between column lines 130 and 140. The magnitude of this current is functionally related to the resistance (approximately 10 KΩ) of memory cell 110, and to the electrical potential between column lines 130 and 140. As discussed above, the RC time constant depends on the capacitance of column lines 130 and 140, the electrical potential between column lines 130 and 140, and the resistance of the resistive memory cell 110. In the posited case where the resistive memory cell is in a low-resistance state, the time to discharge the electrical potential between column lines 130 and 140 is relatively short. Therefore, after an appropriate duration (i.e., at a sensing time), the electrical potentials of column lines 130 and 140 will be substantially equal. This contrasts with the result for a memory cell in a high resistance state, for which the RC time constant is relatively long and a substantial potential would still be found between column lines 130 and 140 at the sensing time.

At the sensing time, a second enabling signal is applied to the P-sense line 160 coupled to a gate of P-channel transistor 102. Transistor 102 is thereby enabled to provide a conductive path between Vdd and the respective sources of transistors 104 and 106. Because column lines 130 and 140 are at substantially equal electrical potential the respective gates of transistors 104 and 106, coupled respectively to column lines 130, 140, are also at substantially equal electrical potential. As a result of the offset described above, however, transistors 104 and 106 behave as if a voltage differential of approximately 100 mV, for example, were present between column lines 130, 140. Accordingly, P-channel transistor 102 is enabled (i.e. becomes conductive) and P-channel transistor 106 is disabled. The conductive P-channel transistor 104 allows current indicated by Arrow 124 to flow through transistors 102 and 104. Consequently, column line 140 assumes an electrical potential of approximately Vdd as the capacitance of column line 140 is charged.

At an appropriate time interval after transistor 102 is enabled, a third sensing signal is applied to the N-sense line 170 which is coupled to a gate of N-channel transistor 112. N-channel transistor 112 consequently forms conductive path between ground and the respective sources of transistors 108 and 114. Due to the above-described action of the P-sense transistors 102, 104 and 106, column lines 130 and 140 are now at substantially different electrical potentials. The respective gates of transistors 108 and 114, coupled respectively to column lines 130 and 140 are thus also at substantially different electrical potentials. Therefore, while transistor 108 remains substantially non-conductive, transistor 114 is enabled to provide, along with transistor 112, a conductive path between column line 130 and ground. A current, indicated by Arrow 122, flows through this conductive path. Remaining electrical potential on column line 130 is thereby discharged to ground. The above-described sensing operation therefore drives column line 140 to Vdd and column line 130 to ground potential.

Figure 3B:
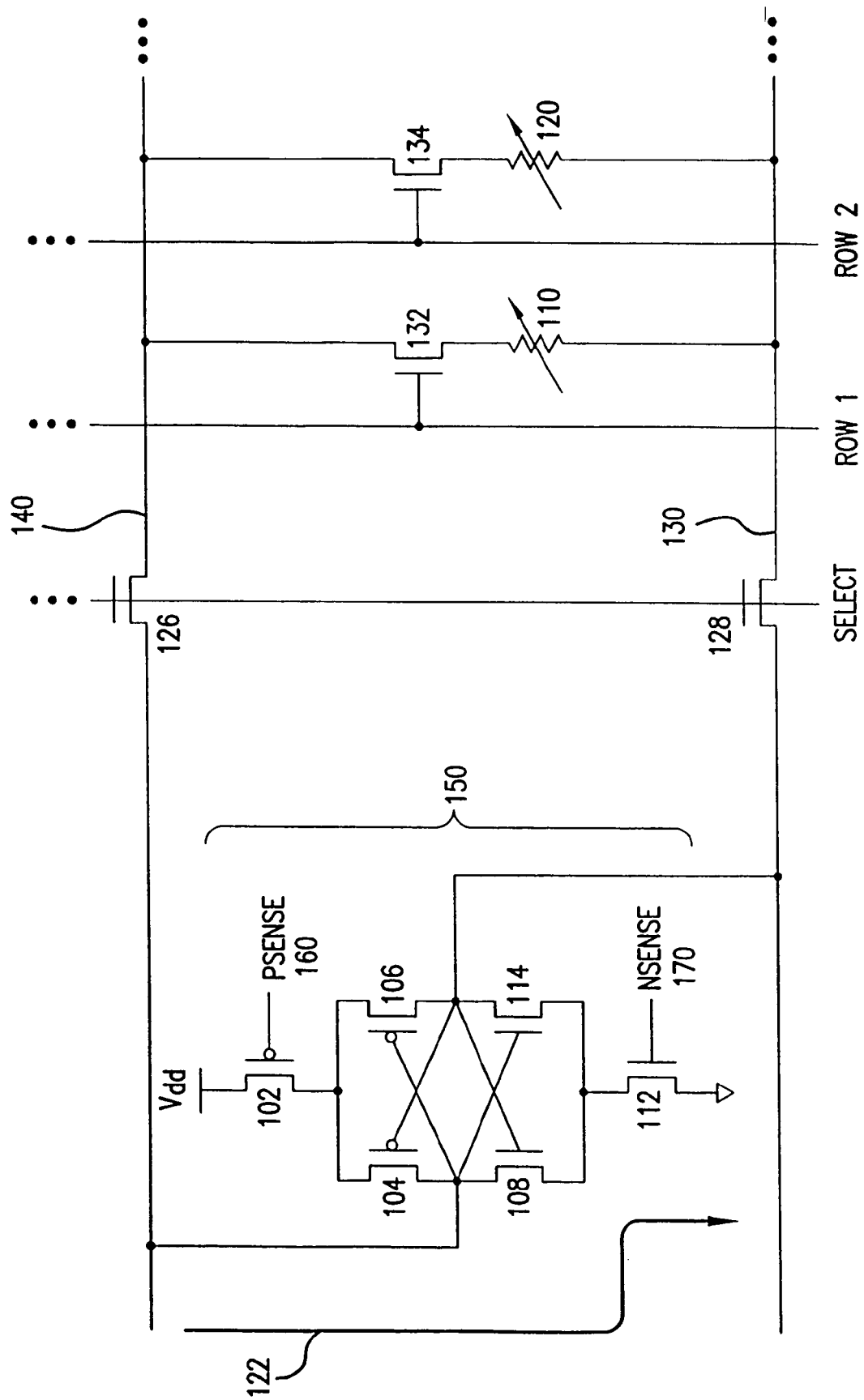
FIG. 3B shows an exemplary circuit according to the invention during sensing of a memory cell in a high-resistance state.

The process by which a high resistance memory cell is sensed by a sense amplifier according to the invention may be understood with respect to FIG. 3B. A high resistance (e.g., 1 MΩ) resistive memory cell 120 is coupled in series with a transistor 134 between the first 130 and second 140 column lines of the resistive memory device. The transistor 134 includes a gate coupled to a row line designated row 2. As described above in relation to the sensing of a low resistance cell, during a preliminary time interval transistor 134 is in a non-conductive state and a differential electrical potential is established between the column lines 130, 140. Thereafter, at an initial time, a first enabling signal is applied to row 2. Responsively, transistor 134 conducts electrical current indicated by arrow 121 between column lines 130 and 140. When sensing a 1 MΩ resistance, the column lines 130, 140 take a relatively long time to equilibrate, so that the sensing operation will be completed well before the equilibration process is complete. Accordingly, when the P-channel transistor 160 of the sense amplifier 150 turns on or "fires", there will still be roughly 200 mV difference between the column lines 130, 140. Because of the built-in 100 mV offset (skew) in the sense amplifier, this 200 mV difference will provide 100 mV (200 mV–100 mV) of signal to trigger the sense amplifier Consequently, transistor 160 is enabled to close a conductive path between Vdd and column line 130. Responsively, an electrical current, indicated by arrow 123, flows from Vdd to column line 130 and column line 140 is charged to voltage Vdd. Meanwhile, transistor 104 remains in a non-conductive state. A few nanoseconds after the P-channel transistor 102 of the sense amplifier 150 fires, the N-channel transistor 112 fires to close a current path between column line 140 and ground. An electrical current, indicated by arrow 125, thus discharges column line 140 to ground potential. In view of the foregoing, it is clear that if, at sensing, column line 130 is at Vdd and column line 140 is at ground potential, then the sensed memory cell is in a low-resistance state. Conversely, if at sensing, column line 140 is at Vdd and column line 130 is at ground potential, then the sensed memory cell is in a high-resistance state.

Figure 4:
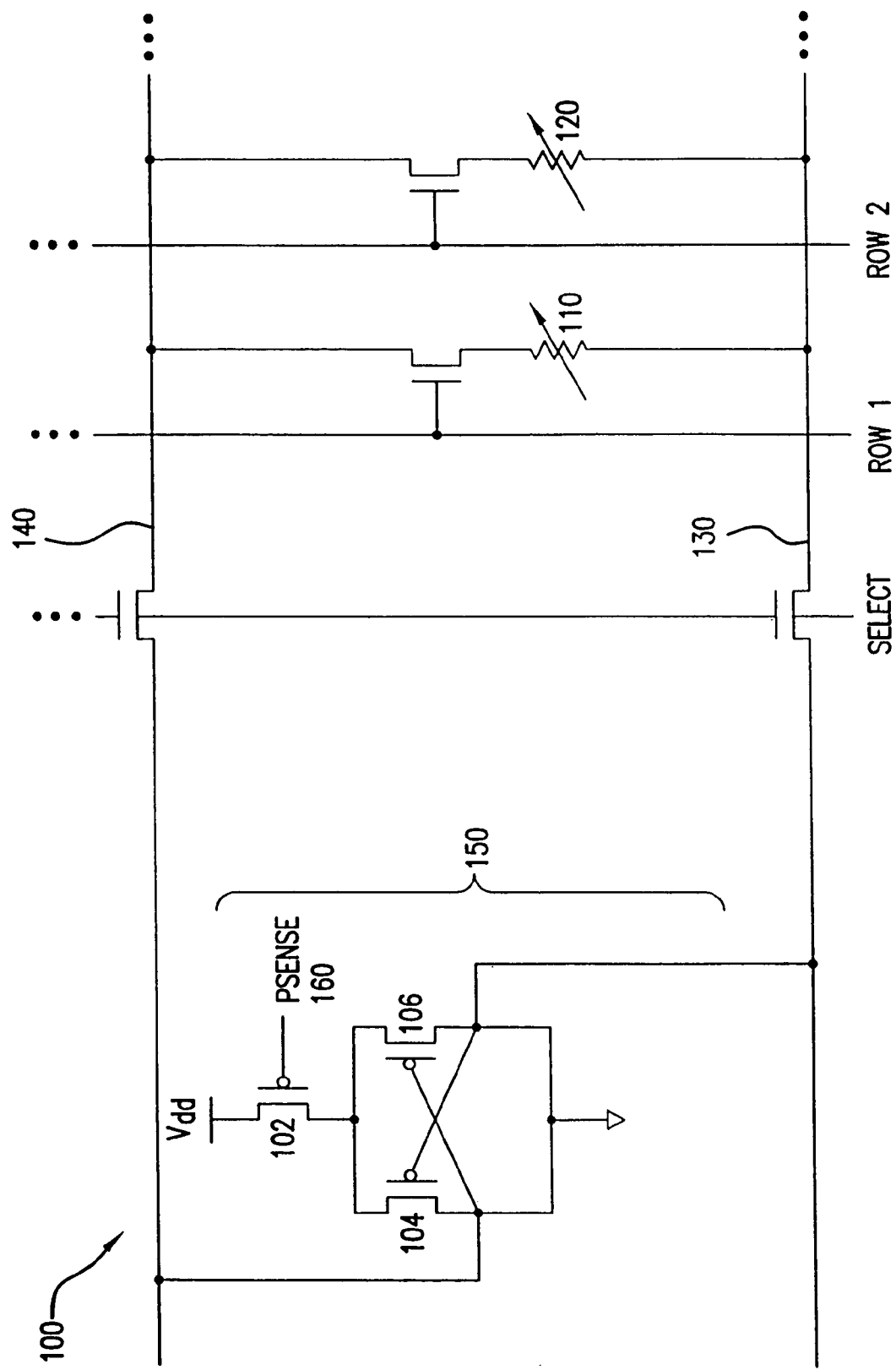
FIG. 4 shows another exemplary embodiment of the invention.

Because the variable resistance memory cell 110 does not have to be refreshed, the sense amplifier 250 of the present invention can be less complex than sense amplifiers used with DRAMs. An example of this is shown in FIG. 4, wherein a P-channel sense amplifier alone is sufficient to accomplish the necessary sensing, without the N-channel portion of the FIG. 1 sense amplifier.

As stated earlier, to avoid accidentally changing the value within the variable resistance memory cell 110, the voltage across the cell is preferably not greater than 250 mV. However, it is also possible to operate with a voltage across the variable resistance memory cell 110 at 300 mV or greater provided the time interval over which the cell is sensed is made shorter. By carefully monitoring the sensing time interval, the memory cell 110 can be operated with higher differential voltages, e.g., as high as about 800 mV or more across the cell 110.

Figure 5:
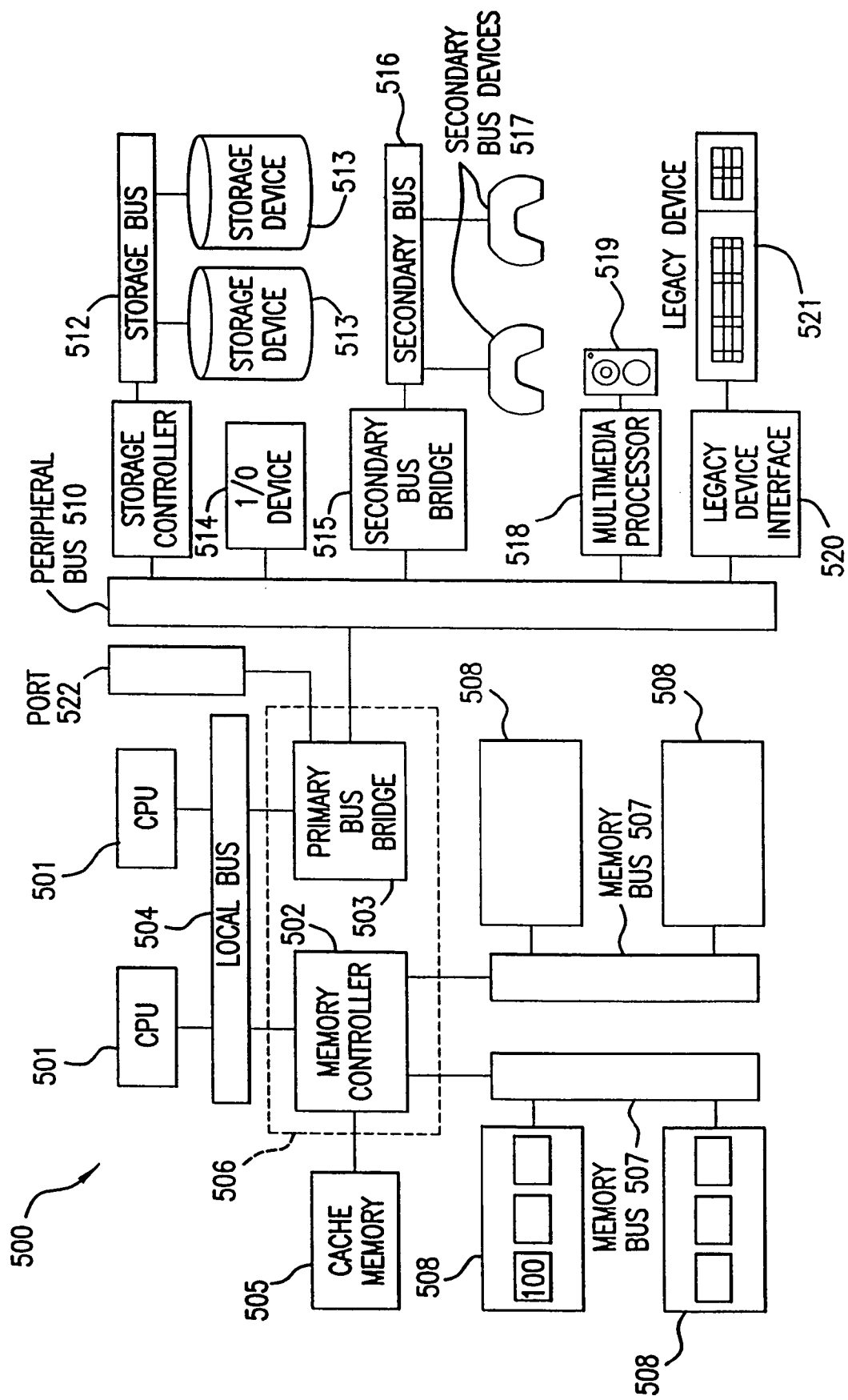
FIG. 5 shows the invention employed within a processor circuit.

FIG. 5 illustrates an exemplary processing system 800 which utilizes a resistive memory device 100 according to the present invention. The processing system 500 includes one or more processors 501 coupled to a local bus 504. A memory controller 502 and a primary bus bridge 503 are also coupled the local bus 504. The processing system 500 may include multiple memory controllers 502 and/or multiple primary bus bridges 503. The memory controller 502 and the primary bus bridge 503 may be integrated as a single device 506.

The memory controller 502 is also coupled to one or more memory buses 507. Each memory bus accepts memory components 508. Any one of memory components 508 may contain a variable resistance memory array of the present invention.

The memory components 508 may be a memory card or a memory module. The memory controller 502 may also be coupled to a cache memory 505. The cache memory 505 may be the only cache memory in the processing system. Alternatively, other devices, for example, processors 501 may also include cache memories, which may form a cache hierarchy with cache memory 505. If the processing system 500 includes peripherals or controllers which are bus masters or which support direct memory access (DMA), the memory controller 502 may implement a cache coherency protocol. If the memory controller 502 is coupled to a plurality of memory buses 507, each memory bus 507 may be operated in parallel, or different address ranges may be mapped to different memory buses 507.

The primary bus bridge 503 is coupled to at least one peripheral bus 510. Various devices, such as peripherals or additional bus bridges may be coupled to the peripheral bus 510. These devices may include a storage controller 511, a miscellaneous I/O device 514, a secondary bus bridge 515, a multimedia processor 518, and a legacy device interface 520. The primary bus bridge 503 may also be coupled to one or more special purpose high speed ports 522. In a personal computer, for example, the special purpose port might be the Accelerated Graphics Port (AGP), used to couple a high performance video card to the processing system 500.

The storage controller 511 couples one or more storage devices 513, via a storage bus 512, to the peripheral bus 510. For example, the storage controller 511 may be a SCSI controller and storage devices 513 may be SCSI discs. The I/O device 514 may be any sort of peripheral. For example, the I/O device 514 may be a local area network interface, such as an Ethernet card. The secondary bus bridge may be used to interface additional devices via another bus to the processing system. For example, the secondary bus bridge may be a universal serial port (USB) controller used to couple USB devices 517 via to the processing system 500. The multimedia processor 518 may be a sound card, a video capture card, or any other type of media interface, which may also be coupled to one of such additional devices as speakers 519. The legacy device interface 520 is used to couple legacy devices, for example, older styled keyboards and mice, to the processing system 500.

The processing system 500 illustrated in FIG. 5 is only an exemplary processing system with which the invention may be used. While FIG. 5 illustrates a processing architecture especially suitable for a general purpose computer, such as a personal computer or a workstation, it should be recognized that well known modifications can be made to configure the processing system 500 to become more suitable for use in a variety of applications. For example, many electronic devices which require processing may be implemented using a simpler architecture which relies on a CPU 501 coupled to memory components 508 and/or memory devices 509. The modifications may include, for example, elimination of unnecessary components, addition of specialized devices or circuits, and/or integration of a plurality of devices.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

What is claimed as new and desired to be protected by Letters Patent of the United States is:

1. A memory circuit comprising:
    a variable resistance memory cell comprising a chalcogenide material;
    a circuit for selectively applying a voltage differential across said memory cell; and
    a sense amplifier selectively coupled across said memory cell for determining a logic state of said cell based on a voltage state existing across said cell at a predetermined period of time after said differential voltage is applied,
    wherein said sense amplifier has an unbalanced voltage sensing characteristic.

2. The memory circuit of claim 1, wherein said selection circuit includes an access transistor coupled to a word line.

3. A memory circuit comprising:
    a variable resistance memory cell comprising a chalcogenide material;
    a circuit for selectively applying a voltage differential across said memory cell; and
    a sense amplifier selectively coupled across said memory cell for determining a logic state of said cell based on a voltage state existing across said cell at a predetermined period of time after said differential voltage is applied,
    wherein said voltage differential is produced by different positive voltages respectively applied to opposite sides of said memory cell.

4. A memory circuit comprising:
    a variable resistance memory cell comprising a chalcogenide material;
    a sense amplifier for measuring resistance of said memory cell and connected to said memory cell via first and second column lines, said sense amplifier comprising:
        a pair of cross-coupled transistors; and
        a transistor connected to said pair of cross-coupled transistors and coupled to a first sense line,
        wherein said cross-coupled transistors differ from each other in operational characteristics so that sensing offset voltage exists between them.

5. The memory circuit of claim 4, wherein said offset voltage assists in causing said sense amplifier to properly sense a voltage state of said memory cell.

6. The memory circuit of claim 4, wherein said pair of cross-coupled transistors of a first conductivity have different channel lengths.

7. The memory circuit of claim 4, wherein said pair of cross-coupled transistors of a first conductivity have different threshold voltages.

8. The memory circuit of claim 4, wherein said pair of cross-coupled transistors of a first conductivity have different threshold voltages.

9. The memory circuit of claim 4, wherein said pair of cross-coupled transistors of a first conductivity have different associated resistances.

10. The memory circuit of claim 4, further comprising a precharge circuit for precharging said column lines to a predetermined differential voltage.

11. The memory circuit of claim 10, wherein said predetermined differential voltage is processed by positive voltages respectively applied to said column lines.

12. A memory circuit comprising:
    a variable resistance memory cell comprising a chalcogenide material; and
    a sense amplifier for measuring the resistance within said memory cell and connected to said memory cell via first and second column lines, said sense amplifier comprising:
        a first pair of cross-coupled transistors of a first conductivity;
        a second pair of cross-coupled transistors of a second conductivity connected adjacent to said first pair of cross-coupled transistors;
        a transistor of said first conductivity connected to said first pair and coupled to a first sense line; and
        a transistor of said second conductivity connected to said second pair and coupled to a second sense line,
        wherein said pair of first cross-coupled transistors differ from each other in operational characteristics so that a sensing offset voltage exists between them.

13. The memory circuit of claim 12, wherein said offset voltage assists in causing said sense amplifier to properly sense a voltage state of said memory cell.

14. The memory circuit of claim 12, wherein said pair of cross-coupled transistors of a first conductivity have different channel lengths.

15. The memory circuit of claim 12, wherein said pair of cross-coupled transistors of a first conductivity have different threshold voltages.

16. The memory circuit of claim 12, wherein said pair of cross-coupled transistors of a first conductivity have different threshold voltages.

17. The memory circuit of claim 12, wherein said pair of cross-coupled transistors of a first conductivity have different associated resistances.

18. The memory circuit of claim 12, further comprising a precharge circuit for precharging said column lines to a predetermined differential voltage.

19. The memory circuit of claim 18, wherein said predetermined differential voltage is processed by positive voltages respectively applied to said column lines.

20. A method of sensing a variable resistance memory cell comprising a chalcogenide material, said method comprising the steps of:
    setting a pair of column lines to a predetermined differential voltage;

selectively connecting said memory cell across said column lines;

operating a sense amplifier coupled at respective inputs to said column lines a predetermined period of time after said selected memory cell receives said differential voltage from said column lines to determine a resistance state of said memory cell.

21. The method of claim 20, wherein said sense amplifier has an unbalanced operational characteristic which creates a voltage sensing offset at said inputs.

22. The method of claim 20, wherein said predetermined voltage is less than a voltage which causes said cell to be written.

23. The method of claim 22, wherein said voltage sensing offset is produced by a cross-coupled pair of transistors having different channel lengths which provides said input sensing offset voltage.

24. The method of claim 22, wherein said voltage sensing offset is produced by a cross-coupled pair of transistors having different channel lengths which provides said input sensing offset voltage.

25. The method of claim 22, wherein said voltage sensing offset is produced by a cross-coupled pair of transistors having different associated capacitances which provides said input sensing offset voltage.

26. The method of claim 22, wherein said voltage sensing offset is produced by a cross-coupled pair of transistors having different associated resistances which provides said input sensing offset voltage.

27. The method of claim 20, wherein said sensing is performed by a precharge circuit for precharging said column lines to a predetermined differential voltage, said memory cell being arranged to cause said differential voltage to be equalized through said memory cell.

28. The method of claim 20, wherein said predetermined differential voltage is produced by setting said column lines to respective positive voltages.

29. The method of claim 20, wherein said activating step further comprises:
enabling at least a first cross-coupled paired transistor circuit of said sense amplifier.

30. The method of claim 29, wherein said activating step further comprises enabling a second cross-coupled paired transistor.

31. A processor circuit comprising:
a processor; and
a memory device for exchanging data with said processor, said memory device comprising:
a variable resistance memory cell comprising a chalcogenide material;
a circuit for selectively applying a voltage differential across said memory cell, said circuit comprising a precharge circuit for precharging a pair of conductive lines to said differential voltage and a selection circuit for selectively connecting said variable resistance memory cell across said precharged pair of conductive lines; and
a sense amplifier selectively coupled across said memory cell for determining a logic state of said cell based on a voltage state existing across said cell at a predetermined period of time after said differential voltage is applied.

32. The processor circuit of claim 31, wherein said pair of conductive lines is a pair of bit lines.

33. A processor circuit comprising:
a processor; and
a memory device for exchanging data with said processor, said memory device comprising:
a variable resistance memory cell comprising a chalcogenide material;
a circuit for selectively applying a voltage differential across said memory cell; and
a sense amplifier selectively coupled across said memory cell for determining a logic state of said cell based on a voltage state existing across said cell at a predetermined period of time after said differential voltage is applied,
wherein said sense amplifier has an unbalanced voltage sensing characteristic which provides said input sensing offset voltage.

34. The processor circuit of claim 33, wherein said circuit for selectively applying a voltage includes an access transistor coupled to a word line.

35. A processor circuit comprising:
a processor; and
a memory device for exchanging data with said processor, said memory device comprising:
a variable resistance memory cell comprising a chalcogenide material;
a circuit for selectively applying a voltage differential across said memory cell; and
a sense amplifier selectively coupled across said memory cell for determining a logic state of said cell based on a voltage state existing across said cell at a predetermined period of time after said differential voltage is applied,
wherein said voltage differential is produced by different positive voltages respectively applied to opposite sides of said memory cell.

36. A memory sense circuit comprising:
a first and second column line;
a variable resistance memory element comprising a chalcogenide material, wherein said variable resistance memory element can be selectively connected across said column lines;
a precharge circuit for precharging said column lines to a predetermined differential voltage; and
a sense circuit for sensing a voltage across said column lines at a predetermined period of time after said resistance is selectively connected across said column lines.

37. The sense circuit of claim 36, wherein said sense amplifier has a pair of conducting branches which are unbalanced and thus adapted to provide said input sensing offset voltage.

38. A memory circuit comprising:
a variable resistance memory cell comprising a chalcogenide material;
a circuit for selectively applying a voltage differential across said memory cell, said circuit comprising: a precharge circuit for precharging a pair of conductive lines to said differential voltage and a selection circuit for selectively connecting said variable resistance memory cell across said precharged pair of conductive lines; and
a sense amplifier selectively coupled across said memory cell for determining a logic state of said cell based on a voltage state existing across said cell at a predetermined period of time after said differential voltage is applied.

39. The memory circuit of claim 38 wherein said pair of conductive lines is a pair of bit lines.

* * * * *